US011675276B2

(12) United States Patent
Pandey

(10) Patent No.: US 11,675,276 B2
(45) Date of Patent: Jun. 13, 2023

(54) METROLOGY APPARATUS AND PHOTONIC CRYSTAL FIBER

(71) Applicant: ASML Netherlands B.V., Veldhoven (NL)

(72) Inventor: Nitesh Pandey, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 511 days.

(21) Appl. No.: 16/540,145

(22) Filed: Aug. 14, 2019

(65) Prior Publication Data

US 2020/0057387 A1    Feb. 20, 2020

(30) Foreign Application Priority Data

Aug. 16, 2018  (EP) .................................. 18189237

(51) Int. Cl.
G03F 7/20      (2006.01)
G01N 21/47     (2006.01)
(Continued)

(52) U.S. Cl.
CPC ..... *G03F 7/70625* (2013.01); *G01N 21/4788* (2013.01); *G01N 21/95607* (2013.01); *G03F 7/70633* (2013.01); *G02B 6/0008* (2013.01)

(58) Field of Classification Search
CPC .... G01N 21/4788; G01N 21/47; G01N 21/88; G01N 21/8803; G01N 21/8806; G01N 21/95; G01N 21/9501; G01N 21/956; G01N 21/4738; G01N 21/474; G01N 21/55; G01N 21/9506; G01N 21/95607; G01N 21/95684; G01N 2021/4735; G01N 2021/4742; G01N 2021/475; G01N 2021/4764;
(Continued)

(56) References Cited

U.S. PATENT DOCUMENTS 4,988,202 A     1/1991  Nayar et al.
5,127,079 A  *  6/1992  Suzuki ................. A61B 1/04
                                                    385/117
(Continued)

FOREIGN PATENT DOCUMENTS

EP       1628164 A2      2/2006
JP    2016138790 A  *   8/2016
(Continued)

OTHER PUBLICATIONS

Partial International Search Report from related International Patent Application No. PCT/EP2019/066584, dated Sep. 9, 2019; 15 pages.
(Continued)

*Primary Examiner* — Gordon J Stock, Jr.
(74) *Attorney, Agent, or Firm* — Sterne, Kessler, Goldstein & Fox P.L.L.C.

(57) ABSTRACT

A metrology apparatus for determining a parameter of interest of a structure formed by a lithographic process on a substrate, the metrology apparatus comprising: an illuminator for illuminating the structure; a lens for collecting at least a portion of radiation diffracted from the structure; and an image sensor for receiving and obtaining a recording of the collected diffracted radiation; wherein the illuminator comprises at least one optical fiber for illuminating the structure directly.

11 Claims, 11 Drawing Sheets

(51) Int. Cl.
*G01N 21/956* (2006.01)
*G03F 7/00* (2006.01)
*F21V 8/00* (2006.01)

(58) Field of Classification Search
CPC .............. G03F 7/7015; G03F 7/70616; G03F 7/70625; G03F 7/70633; G03F 7/70641; G03F 7/7065; G03F 7/2008; G03F 7/70008; G03F 7/70158; G03F 7/70191; G03F 7/70241; G03F 7/7025; G03F 7/70308; G03F 7/70316; G01B 11/02; G01B 11/06; G01B 11/0616; G01B 11/14; G01B 11/16; G01B 11/22; G01B 11/24; G01B 11/26; G01B 11/27; G01B 11/272; G01B 11/28; G01B 11/285; G01B 11/30; G01B 11/303; G01B 11/306; G01B 11/028; G02B 6/001; G02B 6/0008; G02B 6/0033; G02B 6/0035; G02B 6/0043; G02B 6/005; G02B 6/0051; G02B 6/0053; G02B 6/0055; G02B 6/02052; G02B 6/02057; G02B 6/02061; G02B 6/02066; G02B 6/02076; G02B 6/0208; G02B 6/02085; G02B 6/02995; G02B 6/02314; G02B 6/02366; G02B 6/02095
See application file for complete search history.

(56) References Cited

U.S. PATENT DOCUMENTS

| | | | |
|---|---|---|---|
| 5,859,424 A * | 1/1999 | Norton | G02B 27/58 250/226 |
| 6,611,643 B2 * | 8/2003 | Birk | G02B 21/0076 385/38 |
| 6,898,367 B2 * | 5/2005 | Birk | G02B 21/0076 359/368 |
| 6,952,253 B2 | 10/2005 | Lof et al. | |
| 7,295,739 B2 * | 11/2007 | Solarz | G02B 6/02328 385/125 |
| 7,471,435 B2 * | 12/2008 | Modavis | G02B 27/58 359/227 |
| 7,639,351 B2 * | 12/2009 | Chen | B82Y 15/00 356/237.2 |
| 7,701,577 B2 | 4/2010 | Straaijer et al. | |
| 7,791,724 B2 | 9/2010 | Den Boef et al. | |
| 8,115,926 B2 | 2/2012 | Straaijer | |
| 8,553,227 B2 | 10/2013 | Jordanoska | |
| 8,681,312 B2 | 3/2014 | Straaijer | |
| 8,692,994 B2 | 4/2014 | Straaijer | |
| 8,792,096 B2 | 7/2014 | Straaijer | |
| 8,797,554 B2 | 8/2014 | Straaijer | |
| 8,823,922 B2 | 9/2014 | Den Boef | |
| 9,081,302 B2 * | 7/2015 | Den Boef | G01N 21/47 |
| 9,176,072 B2 * | 11/2015 | Zhao | G01N 21/9501 |
| 9,645,093 B2 * | 5/2017 | Sullivan | G01N 21/95623 |
| 9,739,702 B2 * | 8/2017 | Bringoltz | G01N 21/01 |
| 9,897,645 B2 * | 2/2018 | Hoelter | G01J 5/0809 |
| 10,211,592 B1 * | 2/2019 | Villeneuve | G02B 26/101 |
| 10,571,244 B2 * | 2/2020 | Vadakke Matham | G01B 9/02041 |
| 10,895,452 B2 * | 1/2021 | Van Dam | G01N 21/956 |
| 2002/0186368 A1 * | 12/2002 | Rosengaus | G01N 21/9501 356/237.2 |
| 2004/0135995 A1 * | 7/2004 | Hendrix | G01N 21/211 356/237.2 |
| 2005/0174584 A1 * | 8/2005 | Chalmers | G03F 7/70483 356/630 |
| 2005/0259933 A1 * | 11/2005 | Temelkuran | A61F 9/008 606/16 |
| 2006/0093012 A1 * | 5/2006 | Singh | H01S 5/141 372/102 |
| 2007/0181915 A1 * | 8/2007 | Saini | H01L 29/768 257/215 |
| 2007/0296960 A1 | 12/2007 | Den Boef et al. | |
| 2008/0049233 A1 * | 2/2008 | De Groot | G01B 9/02044 356/511 |
| 2008/0198380 A1 | 8/2008 | Straaijer et al. | |
| 2009/0168062 A1 | 7/2009 | Straaijer | |
| 2010/0007863 A1 | 1/2010 | Jordanoska | |
| 2010/0195075 A1 * | 8/2010 | Chan | G02B 13/143 359/857 |
| 2010/0328655 A1 | 12/2010 | Den Boef | |
| 2011/0026032 A1 | 2/2011 | Den Boef et al. | |
| 2011/0032500 A1 | 2/2011 | Straaijer | |
| 2011/0102753 A1 | 5/2011 | Van De Kerkhof et al. | |
| 2011/0102793 A1 | 5/2011 | Straaijer | |
| 2011/0188020 A1 | 8/2011 | Den Boef | |
| 2011/0249244 A1 | 10/2011 | Leewis et al. | |
| 2011/0310388 A1 * | 12/2011 | Hill | G02B 27/145 356/369 |
| 2012/0044470 A1 | 2/2012 | Smilde et al. | |
| 2012/0044495 A1 | 2/2012 | Straaijer | |
| 2013/0162996 A1 | 6/2013 | Straaijer et al. | |
| 2013/0182263 A1 * | 7/2013 | Shchegrov | G01B 11/24 356/512 |
| 2013/0188251 A1 | 7/2013 | Kusunose et al. | |
| 2013/0308142 A1 | 11/2013 | Straaijer | |
| 2014/0240951 A1 * | 8/2014 | Brady | F21V 13/00 362/19 |
| 2016/0161863 A1 | 6/2016 | Den Boef et al. | |
| 2016/0370717 A1 | 12/2016 | Den Boef et al. | |
| 2018/0228374 A1 * | 8/2018 | Cui | A61B 5/0086 |
| 2019/0064676 A1 * | 2/2019 | Gruner | G03F 7/70308 |
| 2019/0384184 A1 * | 12/2019 | Pandey | G03F 7/7015 |
| 2021/0055473 A1 * | 2/2021 | Shnaiderman | G01L 11/025 |
| 2021/0103222 A1 * | 4/2021 | Clube | G03F 7/70408 |

FOREIGN PATENT DOCUMENTS

| | | | |
|---|---|---|---|
| WO | WO-2008156474 A1 * | 12/2008 | ............ B82Y 35/00 |
| WO | WO 2011/012624 A1 | 2/2011 | |
| WO | WO 2014/187656 A1 | 11/2014 | |

OTHER PUBLICATIONS

International Search Report and Written Opinion of the International Searching Authority directed to related International Patent Application No. PCT/EP2019/066584, dated Oct. 30, 2019; 16 pages.

* cited by examiner

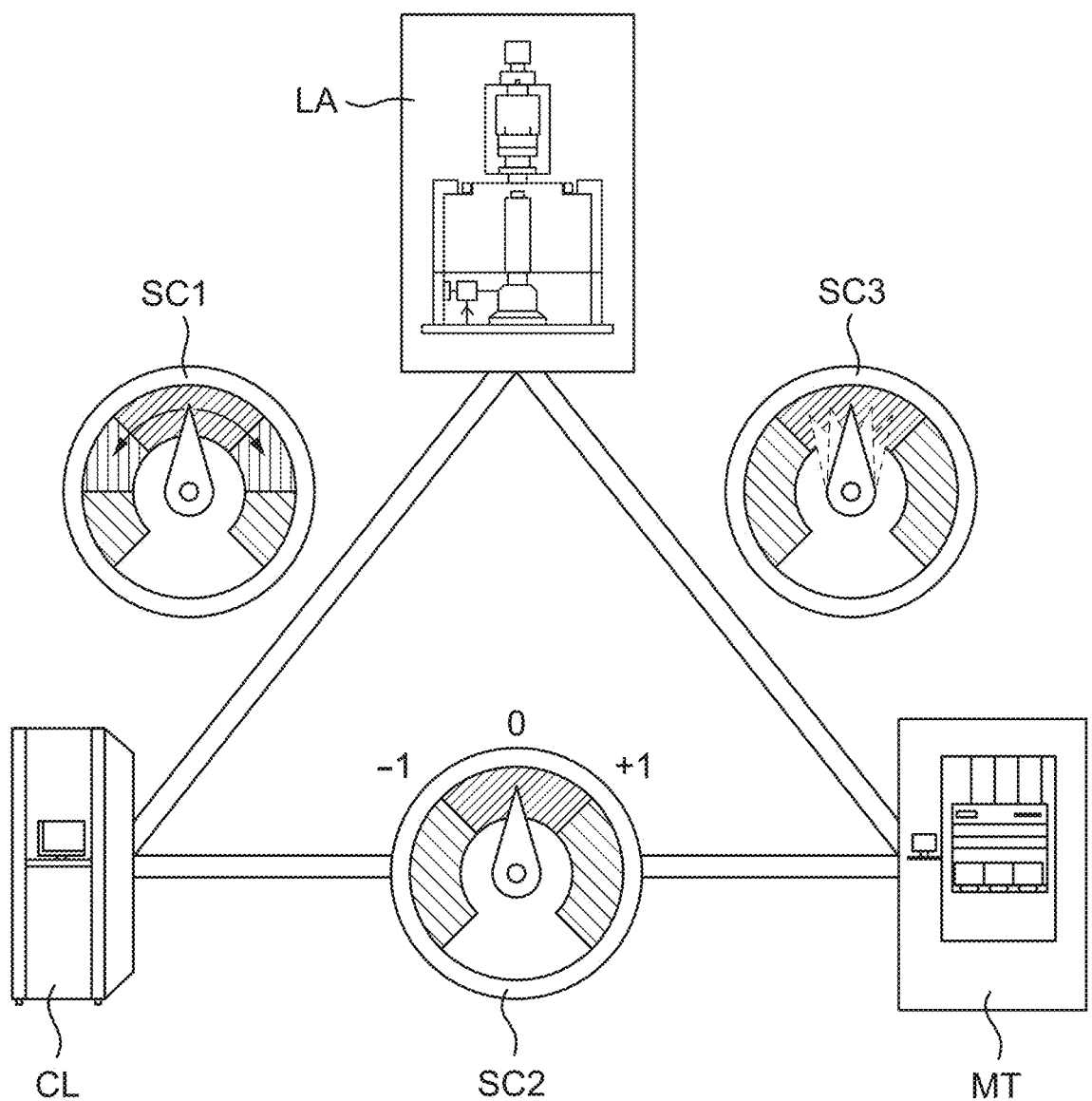

METROLOGY APPARATUS AND PHOTONIC CRYSTAL FIBER

FIELD

The present invention relates to a metrology apparatus for determining a parameter of interest of a structure on a substrate, a method for determining the parameter of interest and a photonic crystal fiber for emitting a pattern of radiation from its tip.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

A metrology apparatus can be used to measure parameters of interest of structures on the substrate. For example, a metrology apparatus can be used to measure parameters such as critical dimension, overlay between layers on the substrate and asymmetry of a pattern on the substrate. Rays of measurement radiation are used to illuminate the substrate. The radiation is diffracted by the structure on the substrate. The diffracted radiation is collected by an objective lens and captured by a sensor.

The rays of measurement radiation are provided by light emitted by a light source. This light is directed onto the substrate via a beam splitter and the objective lens that collects the diffracted radiation from the substrate.

For some types of metrology apparatus, only about 15% of the light emitted by the source may be incident on the substrate. The rest of the light is lost. The losses limit the speed with which different structures and different substrates can be measured and the speed of using different wavelengths of measured radiation. Hence, the losses reduce the throughput of the metrology apparatus.

SUMMARY

It is an aim to increase throughput of the metrology apparatus.

According to an aspect of the invention, there is provided a metrology apparatus for determining a parameter of interest of a structure on a substrate, the metrology apparatus comprising: an illuminator for illuminating the structure; a lens for collecting at least a portion of radiation diffracted from the structure; and an image sensor for receiving and obtaining a recording of the collected diffracted radiation; wherein the illuminator comprises at least one optical fiber for illuminating the structure directly.

According to a further aspect of the present invention, there is provided a method for determining a parameter of interest of a structure on a substrate, the method comprising: illuminating the structure; a lens collecting at least a portion of radiation diffracted from the structure; and receiving and obtaining a recording of the collected diffracted radiation at an image sensor; wherein the structure is illuminated directly from at least one optical fiber.

According to a further aspect of the present invention, there is provided a photonic crystal fiber for emitting a pattern of radiation from its tip, the fiber comprising: a filter formed of a radiation absorbing material at the tip of the fiber, wherein the filter is for apodizing the pattern of emitted radiation.

BRIEF DESCRIPTION OF THE DRAWINGS

Embodiments of the invention will now be described, by way of example only, with reference to the accompanying schematic drawings, in which:

FIG. 3 depicts a schematic representation of holistic lithography, representing a cooperation between three key technologies to optimize semiconductor manufacturing;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
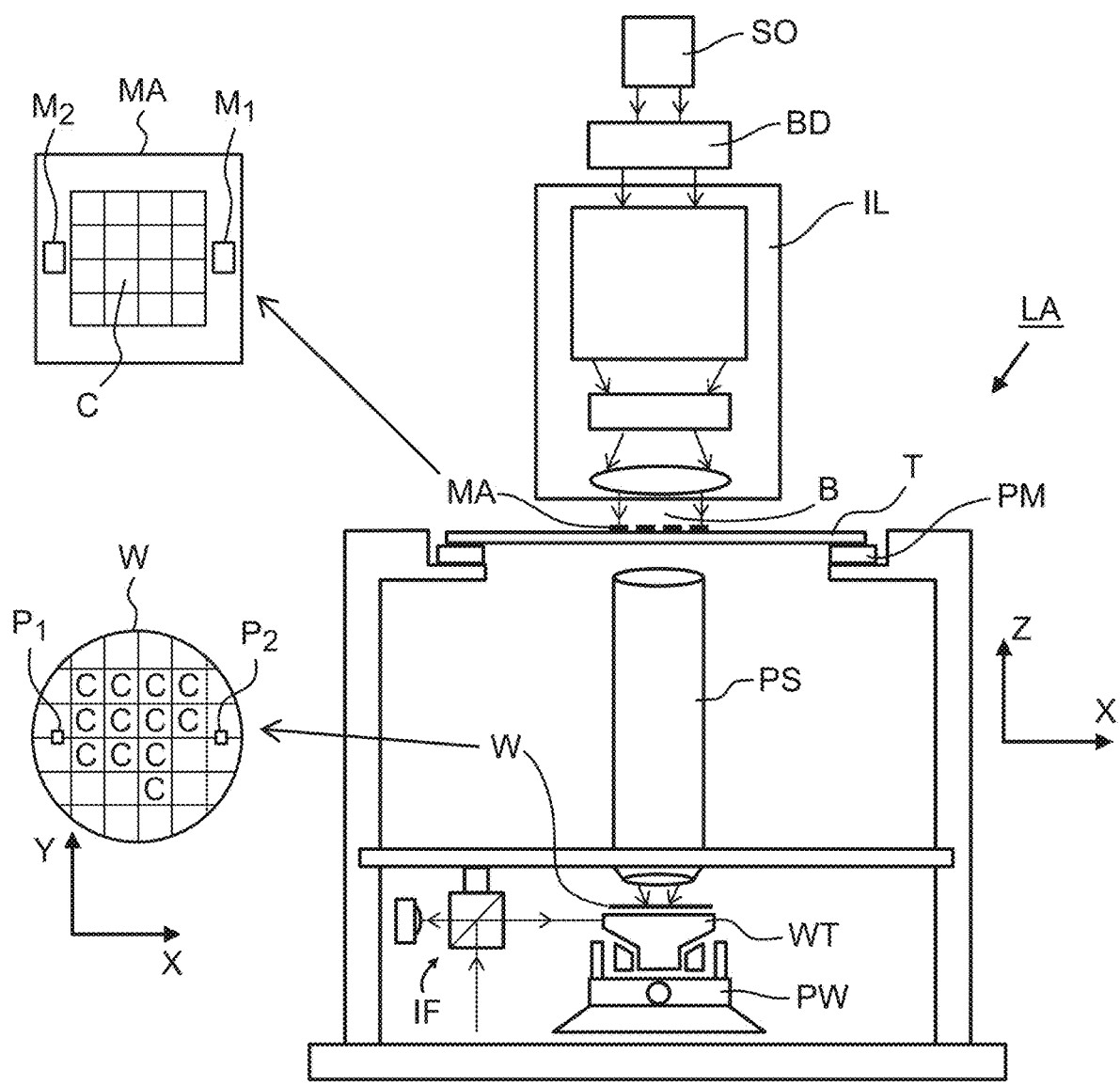
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks $M_1$, $M_2$ and substrate alignment marks $P_1$, $P_2$. Although the substrate alignment marks $P_1$, $P_2$ as illustrated occupy dedicated target portions, they may be located in spaces between target portions. Substrate alignment marks $P_1$, $P_2$ are known as scribe-lane alignment marks when these are located between the target portions C.

Figure 2:
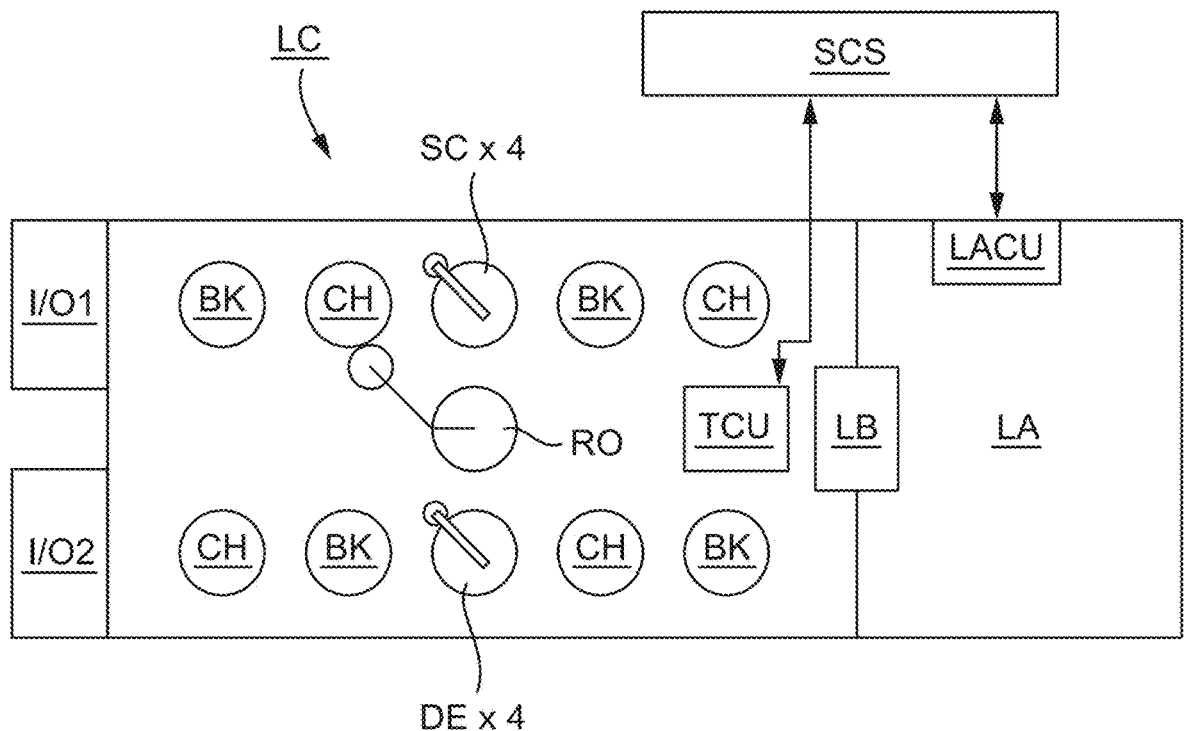
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology apparatus MT (a second system) of the present invention and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology apparatus MT) to predict whether defects may be present due to e.g. sub-optimal processing (depicted in FIG. 3 by the arrow pointing "0" in the second scale SC2).

The metrology apparatus MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Different types of metrology apparatus MT for making such measurements are known, including scanning electron microscopes or various forms of scatterometer metrology apparatus MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US2010249244, US20110026032 or EP1,628,164A, incorporated herein by reference in their entirety. Aforementioned scatterometers may measure gratings using light from soft x-ray and visible to near-IR wavelength range. The metrology apparatus MT of the present invention may be a diffraction based scatterometer.

In a first embodiment, the metrology apparatus MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the metrology apparatus MT is a spectroscopic scatterometer. In such spectroscopic scatterometer, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the metrology apparatus MT is a ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

In one embodiment of the metrology apparatus MT, the metrology apparatus MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

The structure on the substrate which is the metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

For better understanding of the invention, a metrology apparatus according to a comparative example is described below with reference to FIG. 4.

Figure 4A:
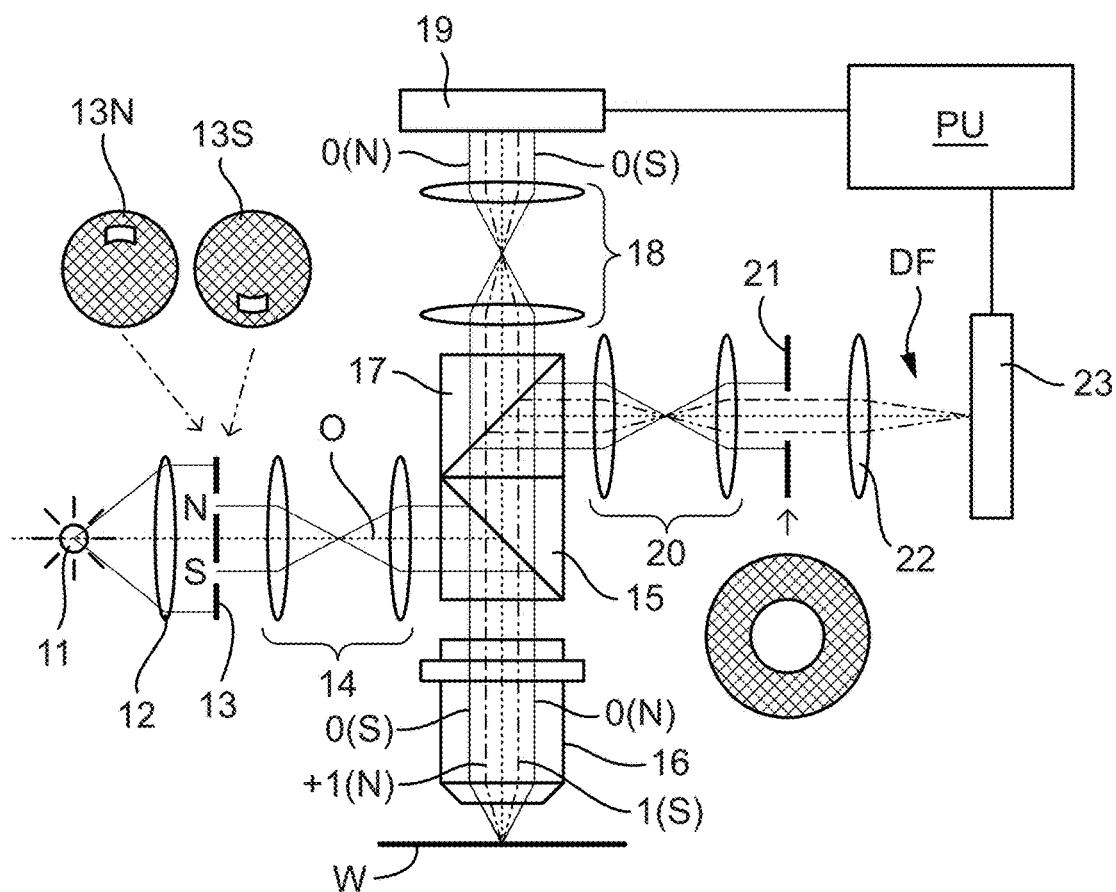
FIGS. 4(a)-4(d) comprise 4(a) a schematic diagram of a dark field scatterometer according to a comparative example for use in measuring targets using a first pair of illumination apertures, 4(b) a detail of diffraction spectrum of a target grating for a given direction of illumination 4(c) a second pair of illumination apertures providing further illumination modes in using the scatterometer for diffraction based overlay measurements and 4(d) a third pair of illumination apertures combining the first and second pair of apertures.

FIG. 4(a) presents of a metrology apparatus according to a comparative example and, more specifically, a dark field scatterometer. A target TT and diffracted rays of measurement radiation used to illuminate the target are illustrated in more detail in FIG. 4(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figure 4B:
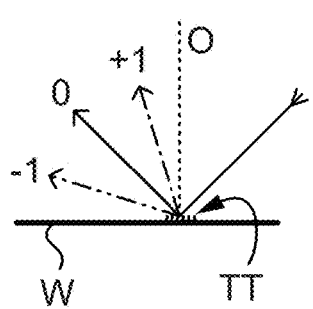

As shown in FIG. 4(b), target TT is placed with substrate W normal to the optical axis O of objective lens 16. The substrate W may be supported by a support (not shown). A ray of measurement radiation I impinging on target TT from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target TT and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 4(a) and 4(b) are shown somewhat off axis, purely to enable them to be more easily distinguished in the diagram.

At least the 0 and +1 orders diffracted by the target TT on substrate W are collected by objective lens 16 and directed back through beam splitter 15. Returning to FIG. 4(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target TT on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 4 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 4) can be used in measurements, instead of or in addition to the first order beams.

Figure 4C:
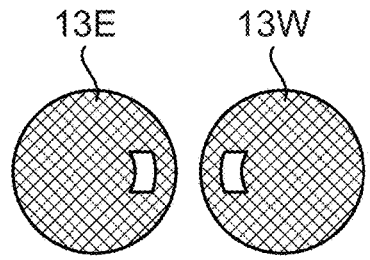
Figure 4D:
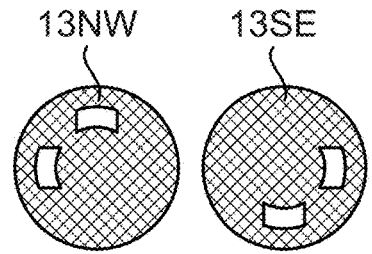

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 4(c) and (d). The use of these, and numerous other variations and applications of the apparatus are described in prior published applications, mentioned above.

The rays of measurement radiation are provided by light emitted by the source 11. This light is directed onto the substrate W via the beam splitter 15 and the objective lens 16 that collects the diffracted radiation from the substrate W.

Only about 15% of the light emitted by the source 11 is incident on the substrate W. The rest of the light is lost. The losses limit the speed with which different structures TT and different substrates W can be measured and the speed of using different wavelengths of measured radiation. Hence, the losses reduce the throughput of the metrology apparatus MT. It is desirable to have a metrology apparatus with an increased throughput.

Figure 5:
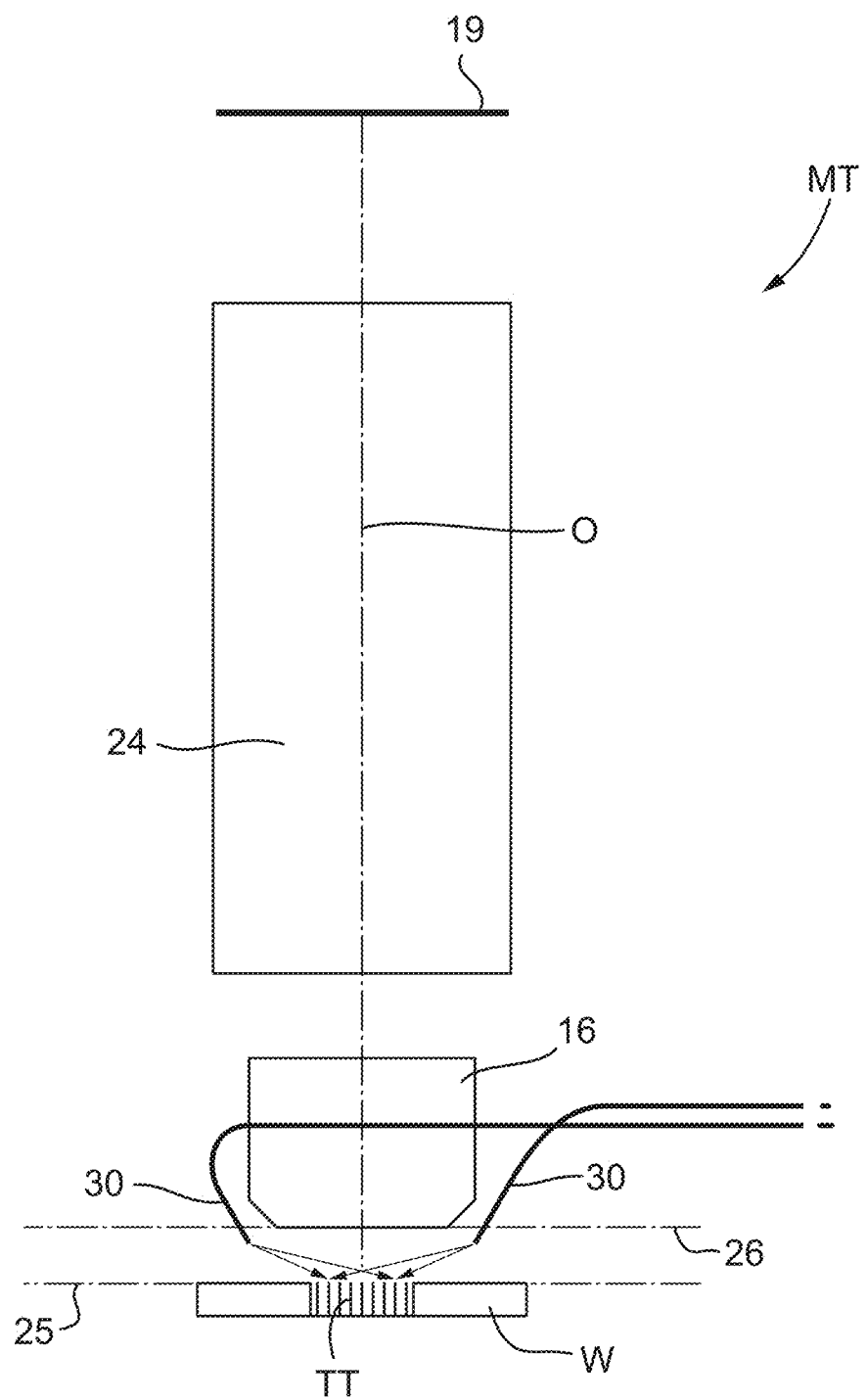
FIG. 5 shows a metrology apparatus according to an embodiment of the invention.

FIG. 5 schematically depicts a metrology apparatus MT according to an embodiment of the invention. The metrology apparatus MT is for determining a parameter of interest of a structure on a substrate W. The structure is a metrology target TT.

In an embodiment, the metrology apparatus MT comprises a lens. In an embodiment, the lens is an objective lens 16. The lens is for collecting at least a portion of radiation diffracted from the structure (i.e. target TT). When the lens is an objective lens 16, it may be similar to the objective lens 16 described above in the context of the metrology apparatus of FIG. 4. In the description below, the lens is described as an objective lens. However, it is not essential that the lens is an objective lens. As an alternative, the lens may be a single lens. The lens may be a singlet, for example a plano-asphere or a bi-asphere. The lens may be any surface with a free form curvature or a Fresnel lens. The lens may comprise materials with a gradient in refractive index.

In an embodiment, the metrology apparatus MT comprises an image sensor 19. The sensor 19 is for receiving an obtaining a recording of the collected diffracted radiation. The sensor 19 may be similar to the sensor 19 described above in the context of the metrology apparatus shown in FIG. 4.

In an embodiment, the metrology apparatus MT comprises optics 24. The optics 24 are for transmitting the collected diffracted radiation to the sensor 19. The optics 24 may comprise one or more optical elements such as a lens, a beam splitter and an optical mask.

In an embodiment, the metrology apparatus MT comprises an illuminator. The illuminator is for illuminating the target TT. As shown in FIG. 5, the illuminator comprises at least one optical fiber 30. The optical 30 is for illuminating the target TT directly.

In the comparative example of a metrology apparatus shown in FIG. 4, the target TT is illuminated by radiation emitted by the source 11 and transmitted through various optical elements including the objective lens 16. The metrology apparatus MT of the present invention is different in that the target TT is illuminated directly by the optical fiber 30. This means that when the illumination radiation is emitted from the optical fiber 30 it is not transmitted through further optics such as any lens or beam splitter. In particular, the illumination radiation that is emitted from the optical fiber 30 does not pass through the objective lens 16 before it is incident on the target TT.

The metrology apparatus MT may be considered to comprise an illumination branch and a detection branch. The illumination branch comprises the elements for illuminating the target TT with the illumination radiation. The detection branch comprises the elements for collecting and ultimately detecting the diffracted radiation. In an embodiment of the invention, the illumination branch comprises at least one optical fiber 30. The at least one optical fiber 30 is arranged outside of the detection branch. In an embodiment, the illumination branch does not share any elements with the detection branch. This is different from the comparative example shown in FIG. 4, in which some elements are shared by the illumination branch and the detection branch. For example, the objective lens 16 forms part of the illumination branch and also part of the detection branch.

An embodiment of the invention is expected to achieve a reduction in loss of radiation in the illumination branch. Of course, some of the light may be lost between the light source and the target TT. Some of the radiation can be lost when it is transmitted through the optical fiber 30. However, the losses are reduced compared to the comparative example of a metrology apparatus shown in FIG. 4. The losses in the optical fiber 30 are less than the losses through the optical elements such as the objective lens 16.

According to an embodiment of the invention, the illumination branch of metrology apparatus shown in FIG. 4 is not needed. Instead, at least one optical fiber 30 is provided. In an embodiment, the tip of the at least one optical fiber 30 is positioned close to the surface of the target TT. Accordingly, it is not necessary to provide other optical elements such as beam splitters. The transmission of radiation to the target TT is more efficient, with lower losses. The transmission of radiation to the target TT can be over a wide wavelength range which can, for example, extend from UV (350 nm) to infrared (2000 nm).

An embodiment of the invention is expected to achieve a wider range of possible wavelengths of illumination radiation. In particular, in an embodiment the at least one optical fiber 30 can transmit a wide range of wavelengths of radiation with relatively low losses. By providing lower losses of illumination radiation, it is possible to perform the metrology measurements more quickly. For example, a larger number of targets TT and/or a larger number of substrates W can be measured in a given period of time. Furthermore, a greater number of different wavelengths of illumination radiation can be used within a given period of time.

An embodiment of the invention is expected to achieve an increase in power of radiation incident on the target TT. By reducing the losses the illumination radiation when it is transmitted to the target TT, the illumination energy incident on the target TT can be increased. This is possible without increasing the power of the source of the illumination radiation. This means that existing (i.e. known) light sources can be used while increasing the power of radiation incident on the target TT. It is not necessary to develop a new light source with increased power in order to increase the amount of radiation incident on the target TT.

The metrology apparatus MT of the present invention may be particularly appropriate for inspecting the target TT after exposed resist has been developed (i.e. an after development inspection), such as an overlay measurement. This is because it is not necessary for the illumination radiation to be provided from the whole of the objective lens 16 for such measurements. For some metrology applications where a small spot is required, it may remain more appropriate for the objective lens 16 to be used to transmit the illumination radiation to support generating a small illuminating spot and a full open pupil plane detection.

In an embodiment, the tip 40 of the at least one optical fiber 30 is at most 1 mm, optionally at most 500 µm, optionally at most 250 µm, optionally at most 200 µm and optionally at most 100 µm from the target TT. The tip 40 of the optical fiber 30 is positioned close to the target TT. When the light is emitted from the tip 40 of the optical fiber 30, the light diverges. If the distance between the tip 40 and the target TT is too great, then the radiation incident in a spot 31 on the target TT may not be sufficiently intense for the measurements to be made accurately.

In an embodiment, the tip 40 of the optical fiber 30 is at least 50 µm, optionally at least 100 µm, optionally at least 200 µm and optionally at least 250 µm from the target TT. If the tip 40 touches the target TT, then the manufacture of a device using the substrate W may be undesirably affected. The tip 40 is positioned sufficiently far from the target TT to make it unlikely that the tip 40 contacts the target TT or any other part of the substrate W during the metrology process. The surface of the substrate W may be undesirably uneven. There may be contaminating particles on the substrate W. The tip 40 of the optical fiber 30 is positioned so that the tip 40 does not touch the substrate W, taking into account that the surface of the substrate W may be uneven or have contaminating particles on it.

Figure 6:
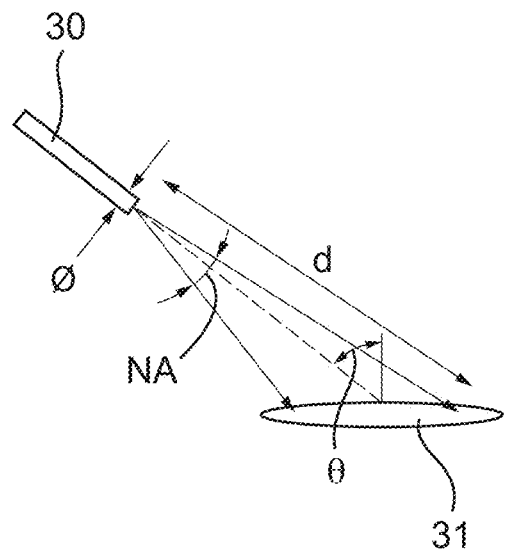
FIG. 6 shows how an illumination spot size is estimated.

FIG. 6 schematically shows the size of the spot 31 of radiation illuminating the target TT. The size of the spot 31 can be estimated using the dimensions show in FIG. 6. The size S of the spot 31 increases with increasing optical fiber diameter φ. The spot 31 may be elliptical having a width $S_{width}$ and a length $S_{length}$. The size S of the spot 31 increases with increasing distance d between the tip 40 of the optical fiber 30 and the target TT. The size S of the spot 31 increases with increasing angle NA representing the spread of rays of radiation emitted from the optical fiber 30. The size S of the spot 31 increases with increasing azimuthal angle θ defined between a normal to the target TT and a central ray of radiation from the optical fiber. The size S of the spot 31 may be estimated by the following formulae.

$$S_{width} \approx \varphi + 2d \cdot NA$$

$$S_{length} \approx (\varphi + 2d \cdot NA)/\cos\theta$$

In an embodiment, the optical fiber diameter φ is at least 10 µm and optionally 20 µm. In an embodiment, the optical fiber diameter φ is at most 50 µm and optionally at most 20 µm. In an embodiment, the angular illumination numerical aperture NA is at least 0.05 rad and optionally at least 0.10 rad. In an embodiment, the angle NA is at most 0.2 rad and optionally at most 0.1 rad. In an embodiment, the azimuthal angle θ is at least 45°, optionally at least 60°, optionally at least 700 and optimally at least 750. A greater azimuthal angle allows the optical fiber 30 to be positioned further to the side out of the way of the objective lens 16. In an embodiment, the azimuthal angle θ is at most 85°, optionally at most 800, optionally at most 750 and optionally at most 700. A smaller azimuthal angle θ allows the spot 31 to be more circular in shape.

The spot 31 may be elliptical. If the optical fiber diameter φ is 20 µm, the distance d between the tip 40 and the target TT is 200 µm and the angle NA is 0.1 rad, then the spot 31 has a width of about 60 µm. Further, if the azimuthal angle θ is about 70°, then the length of the spot 31 is about 180 µm.

However, it is not essential for the spot 31 to be elliptical. In an embodiment, the spot 31 is circular. For example, the spot 31 may be made circular if the tip 40 of the fiber 30 is made elliptical.

In an embodiment, the azimuthal angle θ is greater than a maximum collection angle defined between the normal to the target TT and an edge of the objective lens 16 that can collect the radiation diffracted from the target TT. An example of this is shown in FIG. 5. The optical fibers 30 are positioned so that their tips are at a greater angle from the normal to the target TT compared to the edges of the objective lens 16. This means that the optical fibers 30 do not get in the way of any radiation diffracted from the target TT and collected by the objective lens 16. However, it is possible that the azimuthal angle θ could be less than the maximum collection angle such that part of the optical fiber 30 is between the target TT and part of the objective lens 16.

In an embodiment, the tip 40 of the at least one optical fiber 30 is positioned between the objective lens 16 and the target TT in a direction parallel to the optical axis O. The optical axis O is defined by the objective lens 16. In particular, as shown in FIG. 5, the tip 40 may be positioned in a volume that is limited at one side by a first virtual plane 25 formed by a surface of the substrate W and at another side by a second virtual plane 26 parallel to the first virtual plane and touching an end of the objective lens 16 that faces the substrate W.

An example of the this is shown in FIG. 5, where the optical fibers 30 extend down to a position below the end face of the objective lens 16. This can help to position the tip 40 of the optical fiber 30 close to the target TT. However it is not essential for the tip 40 to be between the objective lens 16 and the target TT in a direction parallel to the optical axis. For example, the tip 40 could be positioned just above the end face of the objective lens 16, but to one side of it. This could be done while ensuring that the tip 40 does not interfere with any diffracted radiation from the target TT that could be collected by the objective lens 16.

In an embodiment, the tip 40 of the optical fiber 30 is positioned radially outward of the objective lens 16, in a direction perpendicularly away from the optical axis. An example of this is shown in FIG. 5. In FIG. 5, the tips of the optical fibers 30 are positioned radially outward of the outer extremity of the objective lens 16. This helps to ensure that the optical fiber 30 does not get it the way of radiation diffracted by the target TT that could be collected by the objective lens 16. However, it is not essential for the tip 40 to be positioned radially outward of the objective lens 16. For example, the tip 40 could be positioned radially just inward of the outer extremity of the objective lens 16. This could be done while still ensuring that the azimuthal angle θ is greater than the maximum collection angle of the objective lens 16. This would ensure that the optical fiber 30 does not interfere with any potentially collected diffracted radiation from the target TT.

In an embodiment, the target TT comprises a first grating of lines in a first direction and a second grating of lines in a second direction orthogonal to the first direction. In an embodiment, a conical angle is defined between the first direction and a central ray of radiation from the optical fiber 30 when viewed along the optical axis. Hence, the conical angle affects the angle between the radiation emitted from the optical fiber 30 and the lines of the gratings.

In an embodiment, the conical angle is about 45°. By providing that the conical angle is about 450, the angle between the grating lines and the illumination radiation (when viewed along the optical axis) is the same for both the first grating and the second grating of the target TT. Both of the gratings can diffract the illumination radiation at the same time. This can increase the throughput of the metrology apparatus MT. However, it is not essential that the conical angle is 45°. The conical angle could be different from 45°. For example, the conical angle could be selected to be between 30° and 60°.

Figure 7:
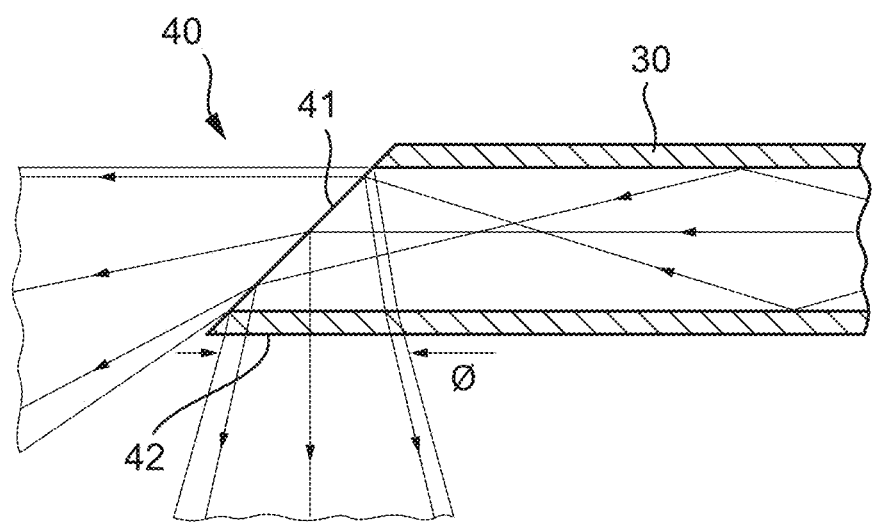
FIG. 7 shows part of an optical fiber according to an embodiment of the invention.

FIG. 7 schematically depicts the tip 40 of an optical fiber 30 of a metrology apparatus MT according to an embodiment of the invention. As depicted in FIG. 7, in an embodiment the tip 40 is arranged such that radiation is emitted from a side of the tip 40, at an angle to the axis of the optical fiber 30. The axis of the optical fiber 30 corresponds to the longitudinal direction of the optical fiber 30.

In the optical fiber 30 shown in FIG. 7, the tip 40 is modified (for example by cleaving) so that its end surface is no longer perpendicular to the axis of the optical fiber 30. In an embodiment, the tip 40 comprises a reflective element 41. The reflective element 41 is configured to reflect radiation that is transmitted through the optical fiber 30. The radiation that is reflected by the reflective element 41 is emitted from a side surface 42 of the tip 40. The angle of the tip 40 reflects light laterally out through the side surface 42 of the optical fiber 30. The type of optical fiber 30 shown in FIG. 7 allows greater flexibility of how the optical fiber 30 is positioned in the metrology apparatus MT. In particular, it is not necessary for the optical fiber 30 to be positioned so that its axis points directly towards the target TT. Instead, the optical fiber 30 can be positioned with its axis pointing away from the target TT. The light emitted from the optical fiber 30 reaches the target TT by being emitted through the side surface 42 of the tip 40.

Figure 8:
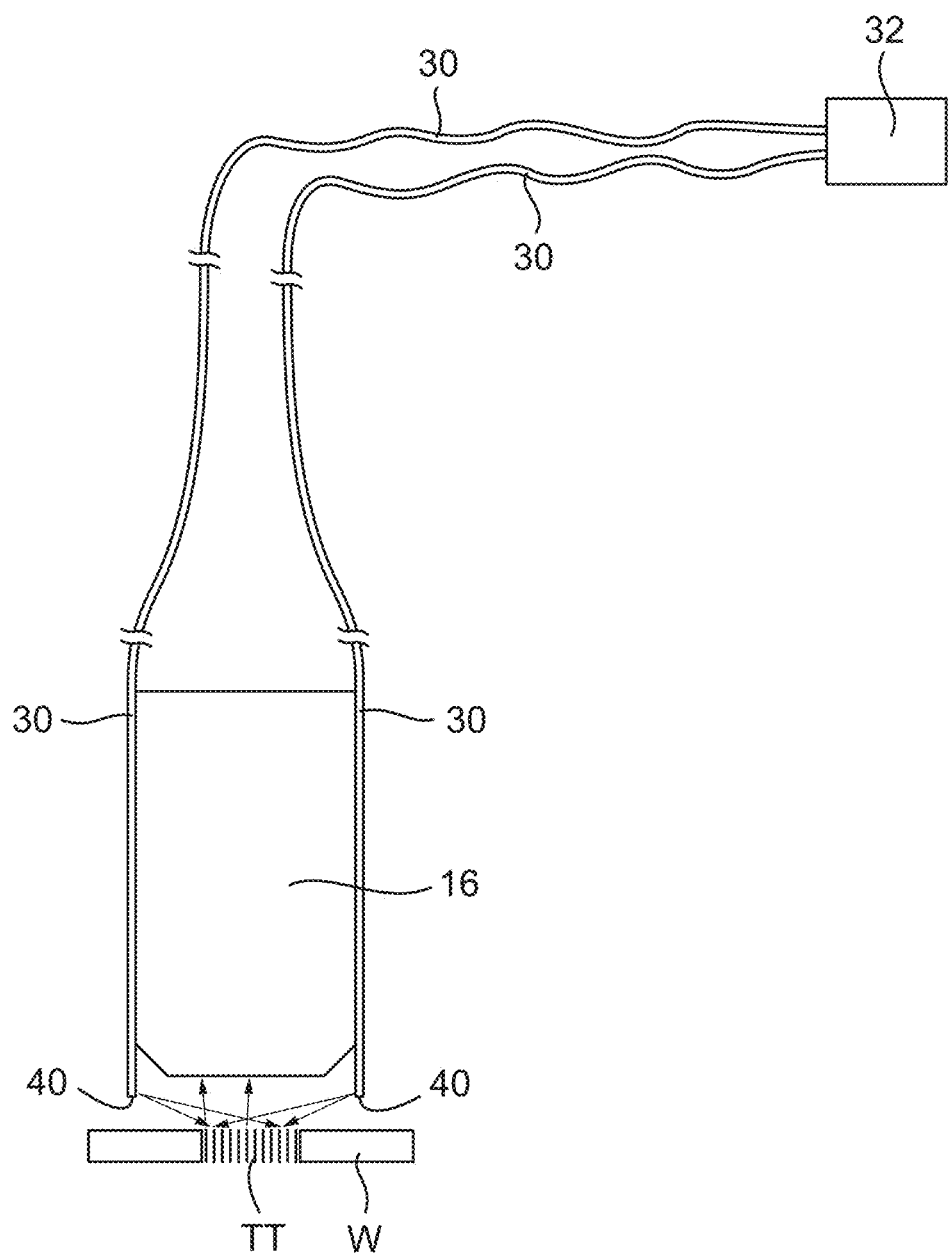
FIG. 8 illustrates how the optical fibers can be arranged relative to the lens in a metrology apparatus according to the invention.

FIG. 8 schematically depicts a positional arrangement between the optical fiber 30 and the objective lens 16 in a metrology apparatus MT according to an embodiment of the invention. As depicted in FIG. 8, in an embodiment the metrology apparatus MT comprises a light source 32. Light generated by the source 32 is transmitted along the optical fibers 30. The light transmitted by the optical fibers 30 is emitted from the tips 40 towards the target TT on the substrate W. This allows for a compact assembly of the fibers 30 and the objective lens 16.

As depicted in FIG. 8, in an embodiment a portion of the optical fiber 30 including its tip 40 extends parallel to the optical axis. The end sections of the optical fibers 30 point directly downwards. As shown in FIG. 8, the optical fibers 30 are radially outward of the objective lens 16. In an embodiment, the optical fiber 30 is attached to the outside of the objective lens 16. The objective lens 16 is positioned directly above the target TT. As a result, the tip 40 is not positioned directly above the target TT. However, radiation is emitted from a side surface 42 (as shown in FIG. 7) of the tip 40 so that the radiation is emitted towards the target TT.

However, it is not essential for the optical fiber 30 to extend parallel to the optical axis. Alternatively, the optical fiber 30 could be arranged so that it points directly towards the target TT. The radiation could be emitted straight out of the end surface of the optical fiber 30 towards the target TT.

Figure 9:
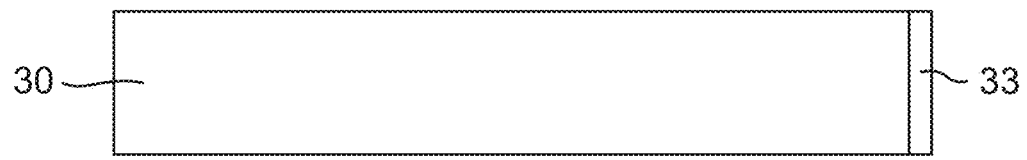
FIG. 9 illustrates an optical fiber according to an embodiment of the invention.

FIG. 9 schematically depicts a side view of an optical fiber 30 according to an embodiment of the invention. In an embodiment, the optical fiber 30 is a photonic crystal fiber. In an embodiment, the photonic crystal fiber comprises air (or other gas) gaps 43 arranged to provide an effective core and cladding for the optical fiber 30. In an embodiment, the optical fiber 30 is formed of a single material.

In an embodiment, the optical fiber 30 is arranged to transmit radiation over a range of wavelengths in a single mode. In an embodiment, the optical fiber 30 is an endlessly single-mode optical fiber 30. This means that a wide range of wavelengths of illumination radiation can be used for the metrology processes.

Figure 10:
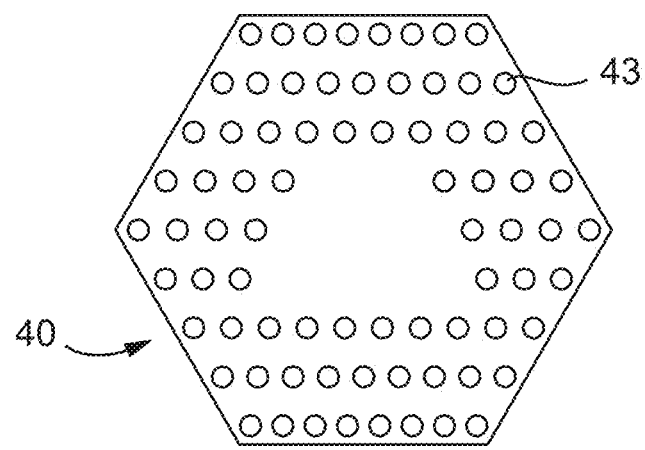
FIG. 10 illustrates part of photonic crystal fiber according to a comparative example.

In an embodiment, the optical fiber 30 allows single mode propagation through the core of the optical fiber 30. FIG. 10 depicts an example of a tip 40 of an optical fiber 30 comprising air gaps 43. As shown in FIG. 10, in an embodiment the core has a hexagonal shape.

As depicted in FIG. 9, in an embodiment the optical fiber 30 comprises a filter 33. The filter 33 is formed of a radiation absorbing material. The filter 33 may be a thin film of an opaque material. As shown in FIG. 9, the filter 33 is at the tip 40 of the optical fiber 30. The filter 33 is for apodizing the pattern of radiation emitted from the optical fiber 30. The material that forms the filter may be opaque.

The pattern of radiation emitted from the optical fiber 30 is affected by the hexagonal shape of the core shown in FIG. 10. The pattern of radiation is correspondingly approximately hexagonal.

Figure 11:
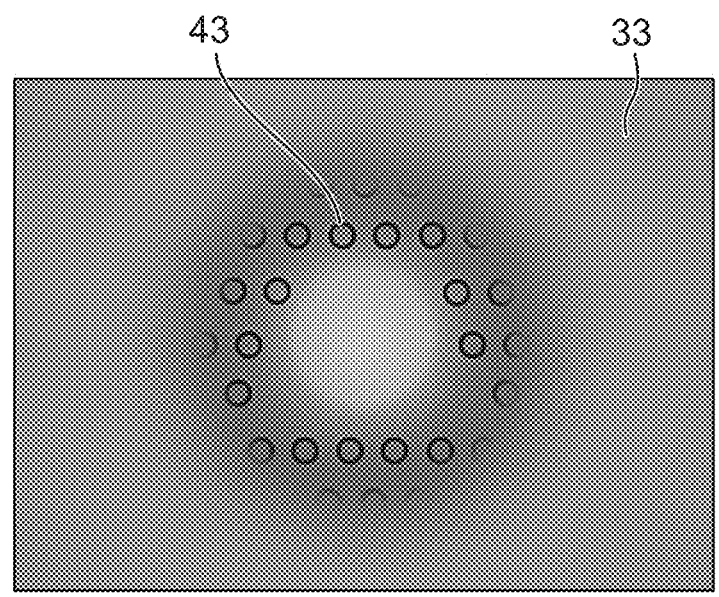
FIG. 11 illustrates part of a photonic crystal fiber according to an embodiment of the invention.
Figure 15:
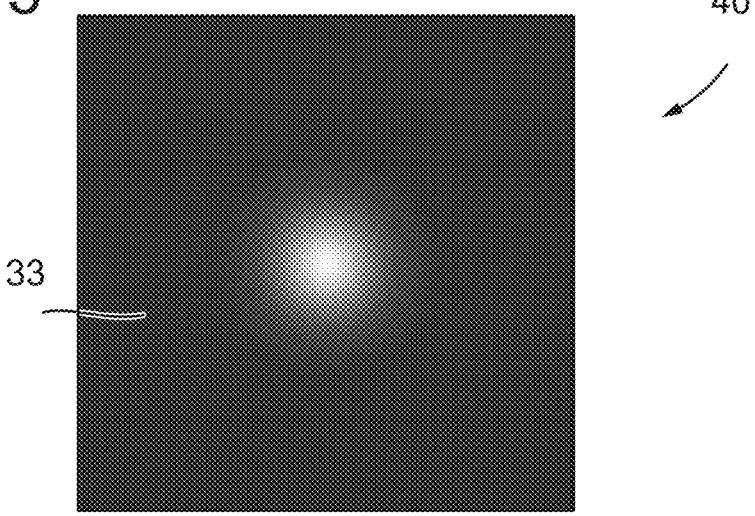
FIG. 15 illustrates part of a photonic crystal fiber according to an embodiment of the invention.

In an embodiment, the filter 33 is configured to increase circular symmetry of the pattern of emitted radiation. For example, FIG. 11 schematically shows the effect of the filter 33 apodizing the pattern of radiation emitted from the optical fiber 30. The filter 33 effectively makes the output of the optical fiber more circular. This can result in a more circular (or more smoothly elliptical) spot 31 on the target TT. This can help to increase the symmetry of the illumination on the target TT and hence improve the accuracy of the metrology measurements. FIG. 15 schematically shows the effect of the filter 33 apodizing the pattern of radiation emitted from the tip 40. FIG. 15 shows the apodization profile of the tip 40.

Figure 12:
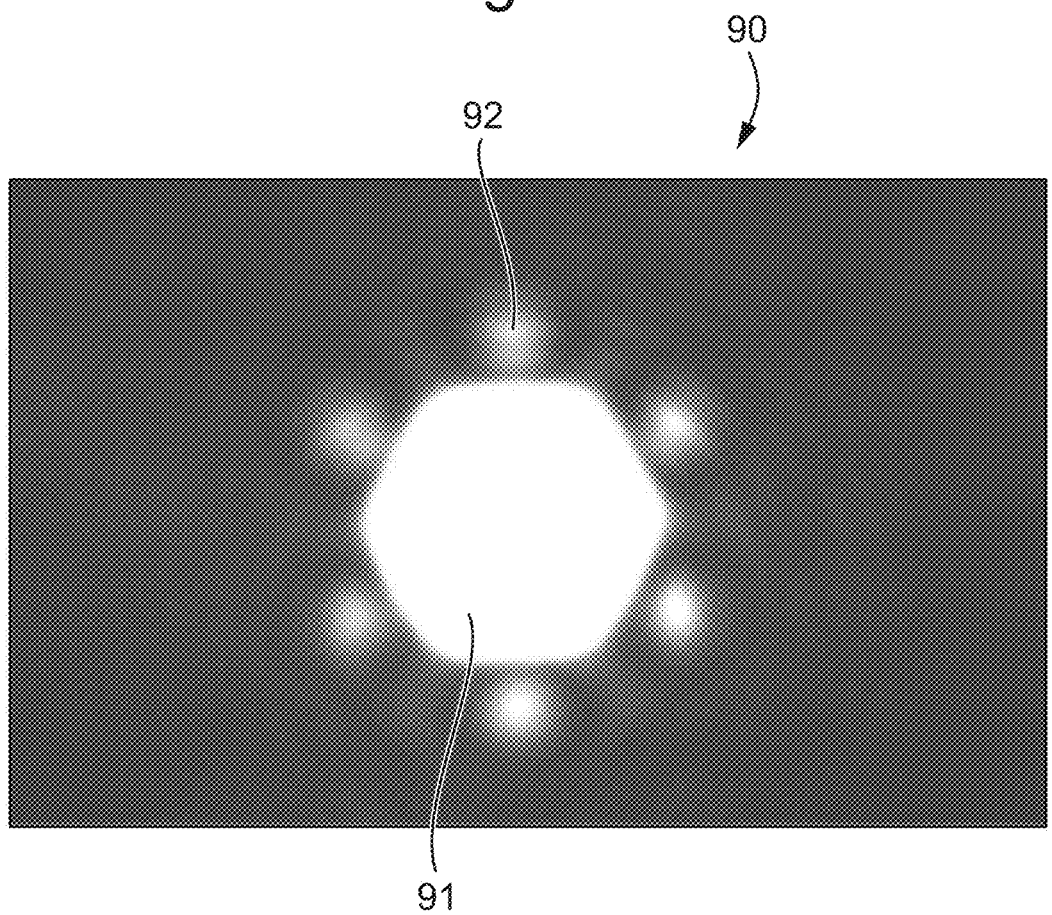
FIG. 12 illustrates a pattern of radiation emitted from a photonic crystal fiber according to a comparative example.
Figure 16:
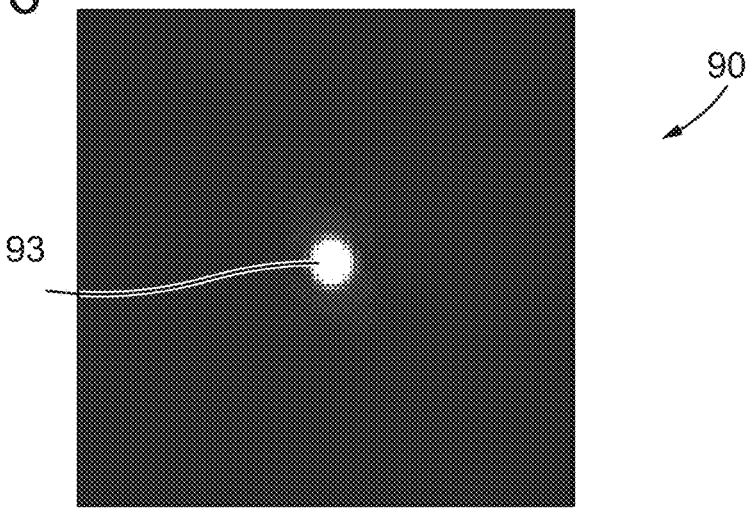
FIG. 16 illustrates a pattern of radiation emitted from a photonic crystal fiber according to an embodiment of the invention.
Figure 17:
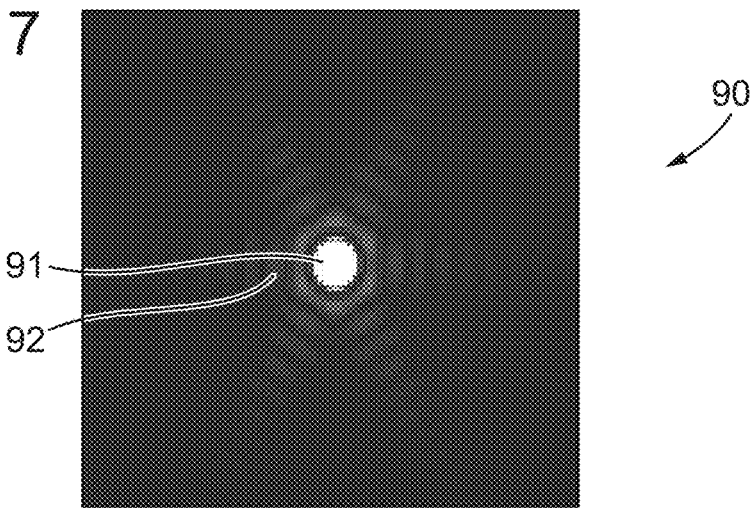
FIG. 17 illustrates a pattern of radiation emitted from a photonic crystal fiber according to a comparative example.

FIG. 12 shows the far field distribution 90 of light emitted from the tip 40 shown in FIG. 10. As shown in FIG. 12, the hexagonal shape of the core shown in FIG. 10 results in a hexagonal diffraction pattern 91. In addition to the hexagonal diffraction pattern 91, the far field distribution 90 comprises side lobes 92. FIG. 17 shows the far field distribution 90 of light emitted from a hexagonal tip 40. As shown in FIG. 17, the hexagonal shape of the core results in a hexagonal diffraction pattern 91. In addition to the hexagonal diffraction pattern 91, the far field distribution 90 comprises side lobes 92. The filter 33 according to an embodiment of the invention results in a different far field distribution that is more circular than the one shown in FIG. 12 and has significantly reduced side lobes. The filter 33 smoothens the output from the tip 40 of the optical fiber 30. This helps to reduce the effects of the non-uniform illumination on the metrology measurements made with the metrology apparatus MT. FIG. 16 shows the far field distribution 90 of light emitted from the tip 40 shown in FIG. 15. As shown in FIG. 16, the apodization profile shown in FIG. 15 results in a more circular diffraction pattern 93.

As mentioned above, the filter 33 is formed of a radiation absorbing material. The material may be opaque. In an embodiment, the material is metal or plastic or a light sensitive inorganic material. However, other radiation absorbing material could be used. The thin film that forms the filter 33 may be deposited on the tip 40 of the fiber surface by means of a chemical vapor deposition process of a metal or by applying a liquid coating of a light sensitive material by means of dip coating or by spraying mechanism. In case of a metal film, a desired transmission profile may be obtained by selectively etching away part of the metal film by a metal tip (e.g. as used in an atomic force microscope) or by using an intense pulsed laser beam. In case of a light sensitive material (e.g. photochromic materials) as the filter film, the transmission profile of the filter 33 may be created by means of light exposure (lithography) of the desired apodizing pattern. The area exposed to light can be made opaque.

In an embodiment, the filter 33 is formed of varying thicknesses of the material at the tip 40 of the optical fiber 30. The filter 33 may be a thin opaque layer coating with a spatially varying transmission profile such that the exit face of the tip 40 of the optical fiber 30 behaves like a circular apodized pinhole. A greater thickness of the material absorbs a greater proportion of incident radiation. Hence, by controlling the thickness of the material, the pattern of radiation emitted from the optical fiber 30 can be controlled. An embodiment of the invention is expected to achieve a more homogenous circular spot 31 on the substrate W.

In an embodiment, the filter 33 is thin. By providing that the filter 33 is thin, the loss of radiation at the filter can be reduced. In an embodiment, the maximum thickness of the material at the filter 33 is at most 100 nm, optionally at most 50 nm, and optionally at most 20 nm.

The filter 33 absorbs light. The filter 33 functions like a low pass filter in signal processing terms. The filter 33 does not affect the transmission properties of the optical fiber 30. However, the filter 33 may absorb in the region of about half of the light transmitted through the optical fiber 30.

Figure 13:
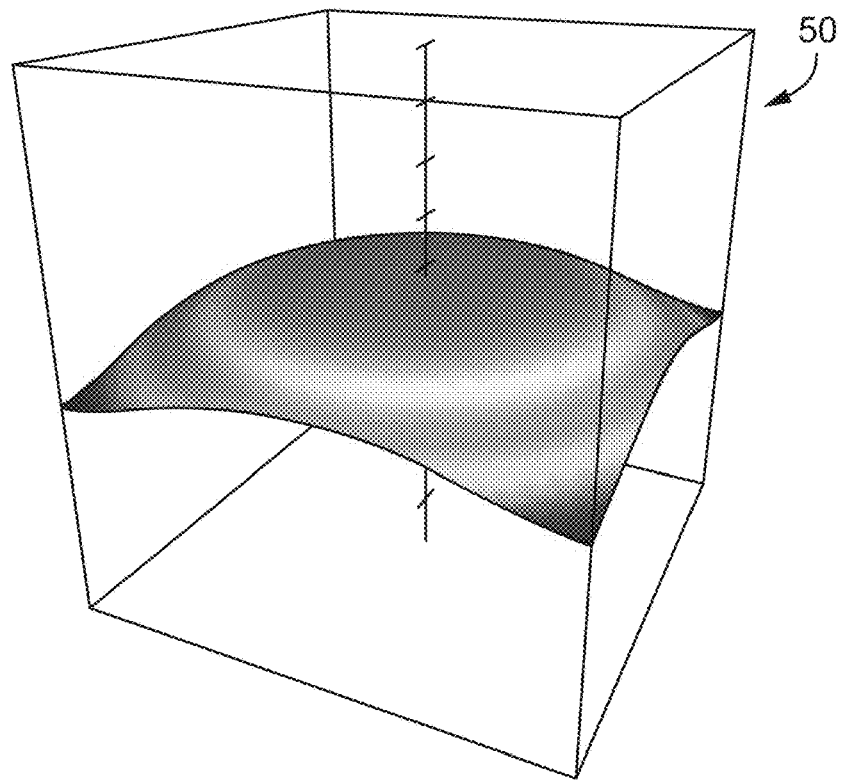
FIGS. 13 and 14 each illustrate a 3D view of a transmittance function of a filter of a photonic crystal fiber according to an embodiment of the invention.

FIG. 13 is a 3D view of a transmittance function 50 of the filter 33. In the example shown in FIG. 13, the transmittance is greatest in the centre of the exit face of the optical fiber 30. The transmittance decreases towards the edges towards the optical fiber 30. This is to provide a more circular pattern of radiation emitted by the optical fiber 30.

Figure 14:
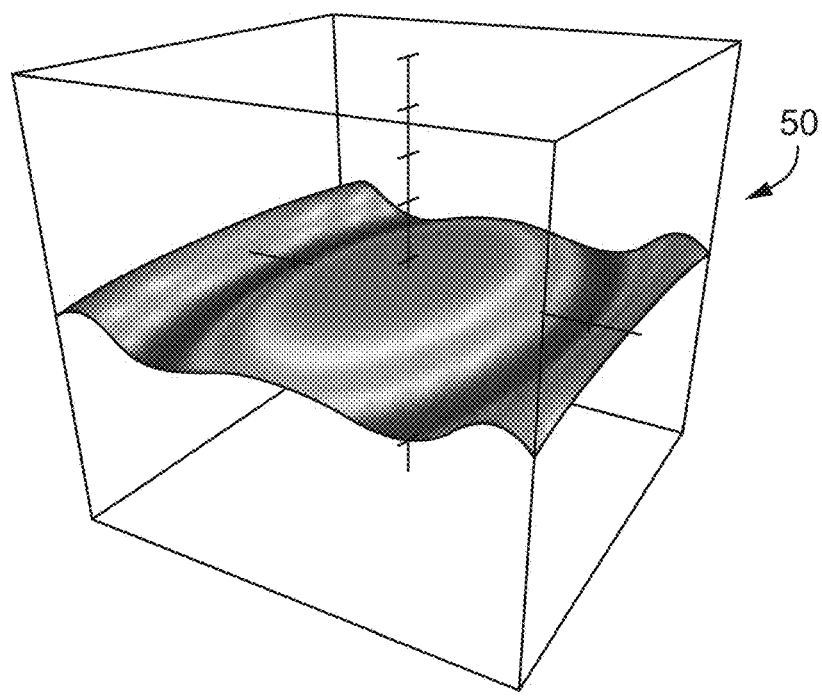

FIG. 14 shows a 3D view of a transmittance function 50 of an alternative filter 33. In an embodiment, the optical fiber 30 has an elliptical core. For example, the core of the optical fiber 30 may be elliptical so as to maintain a polarization of radiation. As shown in FIG. 14, in an embodiment the filter 33 has an elliptical transmission profile. In an embodiment, the filter 33 is arranged such that a direction of elongation of the elliptical transmission profile is orthogonal to direction of elongation of the elliptical core. Hence, the filter 33 compensates for the elliptical shape of the core. The elliptical core may otherwise provide an elliptical pattern of radiation. The filter 33 can be used so as to modify the otherwise elliptical pattern of radiation to make it more circular. Of course, the pattern of radiation may not be made to be perfectly circular.

In an embodiment, the filter 33 is made by exposing the tip 40 of the optical fiber 30 in a chemical vapour deposition chamber. A high power laser beam can be used to etch away parts of the material in order to control the thickness of the material and hence to control the transmission profile. However, other method of forming the filter 33 may be used.

As depicted in FIG. 5, in an embodiment the metrology apparatus MT comprises a plurality of optical fibers 30. However, this is not essential. There may be only one optical fiber 30.

In an embodiment, the metrology apparatus MT is a diffraction based scatterometer.

Further embodiments are disclosed in the subsequent numbered clauses:

1. A metrology apparatus for determining a parameter of interest of a structure on a substrate, the metrology apparatus comprising:
    an illuminator for illuminating the structure,
    a lens for collecting at least a portion of radiation diffracted from the structure, and an image sensor for receiving and obtaining a recording of the collected diffracted radiation;
wherein the illuminator comprises at least one optical fiber for illuminating the structure directly.

2. The metrology apparatus of clause 1, wherein an azimuthal angle defined between a normal to the structure and a central ray of radiation from the optical fiber is greater than a maximum collection angle defined between the normal to the structure and an edge of the lens that can collect the radiation diffracted from the structure.

3. The metrology apparatus of clause 1 or 2, wherein a tip of the at least one optical fiber is at most 250 µm from the structure.

4. The metrology apparatus of any preceding clause, wherein the lens defines an optical axis, and a tip of the at least one optical fiber is positioned in a volume that is limited at one side by a first virtual plane formed by a surface of the substrate and at another side by a second virtual plane parallel to the first virtual plane and touching an end of the lens that faces the substrate.

5. The metrology apparatus of any preceding clause, wherein the lens defines an optical axis, and a tip of the at least one optical fiber is positioned radially outward of the lens, in a direction perpendicularly away from the optical axis.

6. The metrology apparatus of any preceding clause, wherein a tip of the at least one optical fiber is arranged such that radiation is emitted from a side of the tip, at an angle to an axis of the optical fiber.

7. The metrology apparatus of any preceding clause, wherein the lens defines an optical axis, and a portion of the least one optical fiber including its tip extends parallel to the optical axis.

8. The metrology apparatus of any preceding clause, wherein the at least one optical fiber is a photonic crystal fiber.

9. The metrology apparatus of any preceding clause, wherein the at least one optical fiber is arranged to transmit radiation over a range of wavelengths in a single mode.

10. The metrology apparatus of any preceding clause, wherein the at least one optical fiber comprises a filter formed of a radiation absorbing material at the tip of the fiber, wherein the filter is for apodizing a pattern of radiation emitted from the fiber.

11. The metrology apparatus of clause 10, wherein the filter is configured to increase circular symmetry of the pattern of emitted radiation.

12. The metrology apparatus of clause 10 or 11, wherein the material is selected from a group consisting of metal, plastic and light sensitive inorganic materials.

13. The metrology apparatus of any of clauses 10 to 12, wherein the filter is formed of varying thicknesses of the material at the tip of the fiber, wherein a greater thickness of the material absorbs a greater proportion of incident radiation.

14. The metrology apparatus of any of clauses 10 to 13, wherein the fiber has an elliptical core and the filter has an elliptical transmission profile, wherein the filter is arranged such that a direction of elongation of the elliptical transmission profile is orthogonal to a direction of elongation of the elliptical core.

15. The metrology apparatus of any preceding clause, comprising a plurality of optical fibers.

16. The metrology apparatus of any preceding clause, wherein the metrology apparatus is a diffraction based scatterometer.

17. A method for determining a parameter of interest of a structure on a substrate, the method comprising:
illuminating the structure;
a lens collecting at least a portion of radiation diffracted from the structure; and
receiving and obtaining a recording of the collected diffracted radiation at an image sensor;
wherein the structure is illuminated directly from at least one optical fiber.

18. The method of clause 17, wherein an azimuthal angle defined between a normal to the structure and a central ray of radiation from the optical fiber is greater than a maximum collection angle defined between the normal to the structure and an edge of the lens that can collect the radiation diffracted from the structure.

19. The method of clause 17 or 18, wherein the structure comprises a first grating of lines in a first direction and a second grating of lines in a second direction orthogonal to the first direction,
wherein the lens defines an optical axis, and a conical angle defined between the first direction and a central ray of radiation from the optical fiber when viewed along the optical axis is about 45°.

20. The method of any of clauses 17 to 19, wherein a tip of the at least one optical fiber is at most 250 µm from the structure.

21. A photonic crystal fiber for emitting a pattern of radiation from its tip, the fiber comprising:
a filter formed of a radiation absorbing material at the tip of the fiber,
wherein the filter is for apodizing the pattern of emitted radiation.

22. The photonic crystal fiber of clause 21, wherein the filter is configured to increase circular symmetry of the pattern of emitted radiation.

23. The photonic crystal fiber of clause 21 or 22, wherein the material is selected from a group consisting of metal and plastic.

24. The photonic crystal fiber of any of clauses 21 to 23, wherein the filter is formed of varying thicknesses of the material at the tip of the fiber, wherein a greater thickness of the material absorbs a greater proportion of incident radiation.

25. The photonic crystal fiber of any of clauses 21 to 24, wherein the fiber has an elliptical core and the filter has an elliptical transmission profile, wherein the filter is arranged such that a direction of elongation of the elliptical transmission profile is orthogonal to a direction of elongation of the elliptical core.

26. A lithographic cell comprising the metrology apparatus according to one of the clauses 1 to 16 and/or comprising the photonic crystal fiber according to one of the clauses 21 to 25.

27. A metrology apparatus comprising the photonic crystal fiber according to one of the clauses 21 to 25.

28. A lithographic apparatus comprising the photonic crystal fiber according to one of the clauses 21 to 25.

Although specific reference is made in this text to "metrology apparatus" or "inspection apparatus", both terms may also refer to an inspection apparatus or an inspection system. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A metrology apparatus comprising:
   an illuminator comprising at least one photonic crystal fiber including a tip and configured to directly illuminate a structure formed on a substrate by a lithographic process;
   a lens configured to collect at least a portion of radiation diffracted from the structure; and
   an image sensor configured to receive and obtain a recording of the collected diffracted radiation and configured to form an image based on the recording;
   wherein the photonic crystal fiber comprises a filter formed of a radiation absorbing material of varying thicknesses at the tip of the photonic crystal fiber and wherein the filter is configured to apodize a pattern of emitted radiation.

2. The metrology apparatus of claim 1, wherein an azimuthal angle defined between a normal to the structure and a central ray of radiation from the at least one photonic crystal fiber is greater than a maximum collection angle defined between the normal to the structure and an edge of the lens configured to collect the radiation diffracted from the structure.

3. The metrology apparatus of claim 1, wherein the tip of the at least one photonic crystal fiber is at most 250 µm from the structure.

4. The metrology apparatus of claim 1, wherein:
   the lens defines an optical axis, and
   the tip of the at least one photonic crystal fiber is positioned in a volume that is limited at one side by a first virtual plane formed by a surface of the substrate and at another side by a second virtual plane parallel to the first virtual plane and touching an end of the lens that faces the substrate.

5. The metrology apparatus of claim 1, wherein:
   the lens defines an optical axis, and
   the tip of the at least one photonic crystal fiber is positioned radially outward from the lens, in a direction perpendicularly away from the optical axis.

6. The metrology apparatus of claim 1, wherein the filter is configured to increase circular symmetry of the pattern of emitted radiation.

7. The metrology apparatus of claim 1, wherein:
   a greater thickness of the radiation absorbing material absorbs a greater proportion of incident radiation.

8. The metrology apparatus of claim 1, wherein the tip of the at least one photonic crystal fiber is arranged such that radiation is emitted from a side of the tip at an angle to an axis of the at least one photonic crystal fiber.

9. A method comprising:
   illuminating a structure formed on a substrate by a lithographic process;
   collecting at least a portion of radiation diffracted from the structure;
   obtaining a recording of the collected diffracted radiation at an image sensor and forming an image based on the recording, wherein the illuminating is done directly from at least one photonic crystal fiber including a tip, wherein the photonic crystal fiber comprises a filter formed of a radiation absorbing material of varying thicknesses at the tip of the photonic crystal fiber; and
   apodizing a pattern of emitted radiation.

10. The method of claim 9, wherein the tip of the at least one photonic crystal fiber is arranged such that radiation is emitted from a side of the tip at an angle to an axis of the at least one photonic crystal fiber.

11. A lithographic apparatus comprising:
    an illuminator comprising at least one photonic crystal fiber including a tip and configured to directly illuminate a structure formed on a substrate by a lithographic process;
    a lens configured to collect at least a portion of radiation diffracted from the structure; and
    an image sensor configured to receive and obtain a recording of the collected diffracted radiation and configured to form an image based on the recording;
    wherein the photonic crystal fiber comprises a filter formed of a radiation absorbing material of varying thicknesses at the tip of the photonic crystal fiber, and
    wherein the filter is configured to apodize a pattern of emitted radiation.

* * * * *

UNITED STATES PATENT AND TRADEMARK OFFICE
CERTIFICATE OF CORRECTION

PATENT NO. : 11,675,276 B2
APPLICATION NO. : 16/540145
DATED : June 13, 2023
INVENTOR(S) : Pandey It is certified that error appears in the above-identified patent and that said Letters Patent is hereby corrected as shown below:

In the Specification

In Column 6, Line 35, delete "US2010249244," and insert -- US20110249244, --, therefor.

In Column 6, Line 65, delete "is a" and insert -- is an --, therefor.

In Column 12, Line 56, delete "700" and insert -- 70° --, therefor.

In Column 12, Line 56, delete "750." and insert -- 75°. --, therefor.

In Column 12, Line 60, delete "800," and insert -- 80°, --, therefor.

In Column 12, Line 60, delete "750" and insert -- 75° --, therefor.

In Column 12, Line 61, delete "700." and insert -- 70°. --, therefor.

In Column 13, Line 28, delete "the this" and insert -- this --, therefor.

In Column 13, Line 65, delete "450," and insert -- 45°, --, therefor.

Signed and Sealed this
Tenth Day of September, 2024

Katherine Kelly Vidal
*Director of the United States Patent and Trademark Office*